United States Patent
Clark, Jr. et al.

(10) Patent No.: US 6,815,816 B1
(45) Date of Patent: Nov. 9, 2004

(54) IMPLANTED HIDDEN INTERCONNECTIONS IN A SEMICONDUCTOR DEVICE FOR PREVENTING REVERSE ENGINEERING

(75) Inventors: William M. Clark, Jr., Camarillo, CA (US); James P. Baukus, Westlake Village, CA (US); Lap-Wai Chow, South Pasadena, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/696,826

(22) Filed: Oct. 25, 2000

(51) Int. Cl.[7] .................. H01L 23/48; H01L 23/52; H01L 29/40
(52) U.S. Cl. .................. 257/734; 257/774; 257/773
(58) Field of Search .................. 257/734, 368, 257/369, 773–774

(56) References Cited

U.S. PATENT DOCUMENTS

| | | |
|---|---|---|
| 3,673,471 A | 6/1972 | Klein et al. ............. 317/235 R |
| 3,946,426 A | 3/1976 | Sanders ..................... 357/71 |
| 4,017,888 A | 4/1977 | Christie et al. ............. 357/54 |
| 4,101,344 A | 7/1978 | Kooi et al. .................. 148/1.5 |
| 4,139,864 A | 2/1979 | Schulman .................. 358/188 |
| 4,164,461 A | 8/1979 | Schilling .............. 204/192 EC |
| 4,196,443 A | 4/1980 | Dingwall ..................... 357/68 |
| 4,267,578 A | 5/1981 | Vetter ......................... 364/709 |
| 4,291,391 A | 9/1981 | Chatterjee et al. .......... 365/184 |
| 4,295,897 A | 10/1981 | Tubbs et al. ................. 148/1.5 |
| 4,314,268 A | 2/1982 | Yoshioka et al. ............. 357/48 |
| 4,317,273 A | 3/1982 | Guterman et al. ............ 29/571 |
| 4,322,736 A | 3/1982 | Sasaki et al. ................ 257/369 |
| 4,374,454 A | 2/1983 | Jochems ...................... 29/571 |
| 4,409,434 A | 10/1983 | Basset et al. ............... 380/265 |
| 4,435,895 A | 3/1984 | Parillo ......................... 29/571 |
| 4,471,376 A | 9/1984 | Morcom et al. ............... 357/71 |
| 4,581,628 A | 4/1986 | Miyauchi et al. ............. 357/71 |
| 4,583,011 A | 4/1986 | Pechar |
| 4,603,381 A | 7/1986 | Guttag et al. ............... 364/200 |
| 4,623,255 A | 11/1986 | Suszko ....................... 356/389 |
| 4,727,493 A | 2/1988 | Taylor, Sr. ................. 364/490 |
| 4,766,516 A | 8/1988 | Ozdemir et al. ............ 361/380 |
| 4,799,096 A | 1/1989 | Koeppe ....................... 357/42 |
| 4,821,085 A | 4/1989 | Haken et al. ................ 357/67 |
| 4,830,974 A | 5/1989 | Chang et al. ................ 437/34 |
| 4,939,567 A | 7/1990 | Kenney ..................... 257/383 |

(List continued on next page.)

FOREIGN PATENT DOCUMENTS

| | | |
|---|---|---|
| EP | 0 186 855 A2 | 7/1986 |
| EP | 0 364 769 | 4/1990 |

OTHER PUBLICATIONS

Document No. 63129647, dated Jun. 2, 1988, Patent Abstracts of Japan, vol. 012, No. 385 (E–668), Oct. 14, 1998.

(List continued on next page.)

Primary Examiner—Thien F Tran
(74) Attorney, Agent, or Firm—Ladas & Parry LLP

(57) ABSTRACT

A camouflaged interconnection for interconnecting two spaced-apart implanted regions of a common conductivity type in an integrated circuit or device and a method of forming same. The camouflaged interconnection comprises a first implanted region forming a conducting channel between the two spaced-apart implanted regions, the conducting channel being of the same common conductivity type and bridging a region between the two spaced-apart regions, and a second implanted region of opposite conductivity to type, the second implanted region being disposed between the two spaced-apart implanted regions of common conductivity type and over lying the conducting channel to camouflage the conducting channel from reverse engineering.

22 Claims, 2 Drawing Sheets

U.S. PATENT DOCUMENTS

| | | | |
|---|---|---|---|
| 4,962,484 A | 10/1990 | Takeshima et al. | 365/226 |
| 4,975,756 A | 12/1990 | Haken et al. | 357/4.1 |
| 4,998,151 A | 3/1991 | Korman et al. | 257/328 |
| 5,030,796 A | 7/1991 | Swanson et al. | 174/52.2 |
| 5,050,123 A | 9/1991 | Castro | 365/53 |
| 5,061,978 A | 10/1991 | Mizutani et al. | 357/30 |
| 5,065,208 A | 11/1991 | Shah et al. | 357/34 |
| 5,068,697 A | 11/1991 | Noda et al. | 357/23.5 |
| 5,070,378 A | 12/1991 | Yamagata | 357/23.5 |
| 5,101,121 A | 3/1992 | Sourgen | 307/465 |
| 5,117,276 A | 5/1992 | Thomas et al. | 357/71 |
| 5,121,089 A | 6/1992 | Larson et al. | 333/107 |
| 5,121,186 A | 6/1992 | Wong et al. | 257/384 |
| 5,132,571 A | 7/1992 | McCollum et al. | 307/465.1 |
| 5,138,197 A | 8/1992 | Kuwana | 307/449 |
| 5,146,117 A | 9/1992 | Larson | 307/465 |
| 5,168,340 A | 12/1992 | Nishimura | 357/376 |
| 5,177,589 A | 1/1993 | Kobayashi et al. | 257/773 |
| 5,202,591 A | 4/1993 | Walden | 307/450 |
| 5,225,699 A | 7/1993 | Nakamura | 257/306 |
| 5,227,649 A | 7/1993 | Chapman | 257/204 |
| 5,231,299 A | 7/1993 | Ning et al. | 257/316 |
| 5,302,539 A | 4/1994 | Haken et al. | 437/41 |
| 5,308,682 A | 5/1994 | Morikawa | 428/195 |
| 5,309,015 A | 5/1994 | Kuwata et al. | 257/659 |
| 5,317,197 A | 5/1994 | Roberts | 257/401 |
| 5,336,624 A | 8/1994 | Walden | 437/34 |
| 5,341,013 A | 8/1994 | Koyanagi et al. | 257/368 |
| 5,345,105 A | 9/1994 | Sun et al. | 257/659 |
| 5,354,704 A | 10/1994 | Yang et al. | 437/52 |
| 5,369,299 A | 11/1994 | Byrne | 257/638 |
| 5,371,390 A | 12/1994 | Mohsen | 257/209 |
| 5,376,577 A | 12/1994 | Roberts et al. | 437/52 |
| 5,384,472 A | 1/1995 | Yin | 257/204 |
| 5,384,475 A * | 1/1995 | Yahata | 257/314 |
| 5,399,441 A | 3/1995 | Bearinger et al. | 428/689 |
| 5,404,040 A | 4/1995 | Hshieh et al. | 257/341 |
| 5,412,237 A | 5/1995 | Komori et al. | 257/306 |
| 5,441,902 A | 8/1995 | Hsieh et al. | 437/34 |
| 5,468,990 A | 11/1995 | Daum | 257/632 |
| 5,475,251 A | 12/1995 | Kuo et al. | 257/316 |
| 5,506,806 A | 4/1996 | Fukushima | 365/195 |
| 5,531,018 A | 7/1996 | Saia et al. | 29/622 |
| 5,539,224 A | 7/1996 | Ema | 257/211 |
| 5,541,614 A | 7/1996 | Lam et al. | 343/792.5 |
| 5,571,735 A | 11/1996 | Mogami et al. | 437/41 |
| 5,576,988 A | 11/1996 | Kuo et al. | 365/185.04 |
| 5,611,940 A | 3/1997 | Zettler | 73/514.16 |
| 5,638,946 A | 6/1997 | Zavracky | 200/181 |
| 5,677,557 A | 10/1997 | Wuu et al. | 257/382 |
| 5,679,595 A | 10/1997 | Chen et al. | 437/52 |
| 5,719,422 A | 2/1998 | Burr et al. | 257/336 |
| 5,719,430 A | 2/1998 | Goto | 257/403 |
| 5,721,150 A | 2/1998 | Pasch | 437/46 |
| 5,783,846 A | 7/1998 | Baukus et al. | |
| 5,821,590 A | 10/1998 | Lee et al. | 257/377 |
| 5,838,047 A | 11/1998 | Yamauchi et al. | 257/372 |
| 5,854,510 A | 12/1998 | Sur, Jr. et al. | 257/529 |
| 5,866,933 A | 2/1999 | Baukus et al. | |
| 5,880,503 A | 3/1999 | Matsumoto et al. | 257/372 |
| 5,888,887 A | 3/1999 | Li et al. | 438/525 |
| 5,895,241 A | 4/1999 | Lu et al. | 438/275 |
| 5,920,097 A | 7/1999 | Horne | 257/368 |
| 5,930,663 A | 7/1999 | Baukus et al. | 438/598 |
| 5,930,667 A | 7/1999 | Oda | 438/622 |
| 5,973,375 A | 10/1999 | Baukus et al. | |
| 5,977,593 A | 11/1999 | Hara | 257/356 |
| 5,998,257 A | 12/1999 | Lane et al. | 438/253 |
| 6,037,627 A | 3/2000 | Kitamura et al. | 257/324 |
| 6,046,659 A | 4/2000 | Loo et al. | 333/262 |
| 6,054,659 A | 4/2000 | Lee et al. | 200/181 |
| 6,057,520 A | 5/2000 | Goodwin-Johansson | 200/181 |
| 6,080,614 A | 6/2000 | Neilson et al. | 438/238 |
| 6,117,762 A | 9/2000 | Baukus et al. | 438/618 |
| 6,137,318 A | 10/2000 | Takaaki | 326/112 |
| 6,154,388 A | 11/2000 | Oh | 365/185.04 |
| 6,215,158 B1 * | 4/2001 | Choi | 257/368 |
| 6,294,816 B1 | 9/2001 | Baukus et al. | 257/368 |
| 6,326,675 B1 | 12/2001 | Scott et al. | 257/608 |
| 6,503,787 B1 | 1/2003 | Choi | 438/214 |

FOREIGN PATENT DOCUMENTS

| | | |
|---|---|---|
| EP | 0 463 373 | 1/1992 |
| EP | 0 528 302 A1 | 2/1993 |
| EP | 0 585 601 A1 | 3/1994 |
| EP | 0 764 985 A2 | 3/1997 |
| EP | 0 883 184 A2 | 12/1998 |
| EP | 0 920 057 A2 | 6/1999 |
| EP | 1 193 758 A1 | 4/2002 |
| EP | 1 202 353 A1 | 5/2002 |
| FR | 2486717 | 1/1982 |
| JP | 58-190064 | 11/1983 |
| JP | 61-147551 | 7/1986 |
| JP | 63 129647 A | 6/1988 |
| JP | 02-046762 | 2/1990 |
| JP | 02-237038 | 9/1990 |
| JP | 10-256398 | 9/1998 |
| WO | 98/21734 | 5/1998 |
| WO | 98/57373 | 12/1998 |
| WO | 00/44012 | 7/2000 |

OTHER PUBLICATIONS

Patent Abstracts of Japan, vol. 016, No. 197 (p–1350) May 12, 1992 & JP–A–40 28 092 (Toshiba Corp), abstract.

Fredericksen, T.M., "A Multiple–Layer–Metal CMOS Process," *Intuitive CMOS Electronics*, Revised Edition, Section 5.6, pp. 134–146 (1989).

Hodges and Jackson, *Analysis and Design of Digital Integrated Circuits*, 2nd edition, McGraw–Hill, p. 353 (1988).

Larson, L.E., et al., "Microactuators for GaAs–based Microwave Integrated Circuits," *IEEE*, pp. 743–746 (1991).

Lee, "Engineering a Device for Electron–beam Probing," *IEEE Design and Test of Computers*, pp. 36–49 (1989).

Sze, S.M., ed. *VLSI Technology*, McGraw–Hill, pp. 99, 447, and 461–465 (1983).

Blythe, et al., "Layout Reconstruction of Complex Silicon Chips," *IEEE Journal of Solid–State Circuits*, pp. 138–145 (Feb. 1993).

Ng, K.K., *Complete Guide to Semiconductor Devices*, McGraw–Hill, Inc., pp 164–165 (1995).

Sze, S.M., ed., "Silicides for Gates and Interconnections," *VLSI Technology*, McGraw–Hill, pp. 372–380 (1983).

IBM_TDB, "Double Polysilicon Dynamic Memory Cell with Polysilicon Bit Line," pp 3828–3831 (Feb. 1979).

IBM_TDB, "Static Ram Double Polysilicon Process," pp 3683–3686 (Jan. 1981).

Abstract of JP 02–237038, Patent Abstracts of Japan, vol. 014, No. 550 (Dec. 6, 1990).

U.S. patent application Ser. No. 09/882,892, Baukus et al., filed Jun. 15, 2001.

U.S. patent application Ser. No. 10/132,523, Clark, Jr. et al., filed Apr. 24, 2003.

U.S. patent application Ser. No. 10/735,841, Chow et al., filed Dec. 12, 2003.

* cited by examiner

IMPLANTED HIDDEN INTERCONNECTIONS IN A SEMICONDUCTOR DEVICE FOR PREVENTING REVERSE ENGINEERING

This application is related to a subsequently-filed application which is a Continuation in Part (CIP) of this application. The CIP application was filed on Apr. 24, 2002 under Ser. No. 10/132,523. This application is also related to U.S. patent applications Ser. No. 10/735,841, filed Dec. 12, 2003; and Ser. No. 09/882,892, filed on Jun. 15, 2001.

TECHNICAL FIELD

The present invention relates to semiconductor devices and their methods of manufacture wherein the semiconductor devices have implanted interconnections which are hidden and/or camouflaged so as to inhibit or prevent reverse engineering of the semiconductor device.

BACKGROUND OF THE INVENTION

The design and development of semiconductor Integrated Circuits (ICs) tends to be rather expensive and, in fact, many hours of engineering talent are required to develop the complex structures, processes and manufacturing techniques involved in making modern semiconductor devices and ICs. Indeed, semiconductor ICs over the years have tended to become more complex and therefore the effort involved in achieving a successful design has become very expensive. Many man-hours of highly skilled professional time are required at considerable expense to design and develop a modem integrated circuit.

Others, in order to avoid not only the expense involved in the design and development of integrated circuits, but also to avoid the significant time involved in bringing a new integrated circuit design to the market place, resort to reverse engineering practices for existing integrated circuits to take apart, probe, and otherwise examine these existing ICs to try to determine the physical structures and methods used to make the integrated circuit for subsequent copying. This reverse engineering, which typically relies primarily on obtaining planar optical images of a circuit, in essence tries to bypass the typical product development cycles and expenses involved in producing integrated circuits.

Since the reverse engineer is trying to go for a "free ride" on the efforts of others, various approaches have been developed to try to thwart the reverse engineer, particularly in the field of semiconductor integrated circuits. See, for example, U.S. Pat. No. 4,583,011 wherein the device is given a depletion implant that is virtually invisible to a reverse engineer.

Integrated circuits typically comprise a large number of active devices, typically in the form of transistors, diodes, and the like, which are interconnected by the means of interconnects. The interconnects are often provided by metallic structures which are formed on various levels within an integrated circuit device. Since these metallic structures etch away in the presence of an appropriate etchant at a different rate compared to the other structures found in a semiconductor device (such as semiconducting material, insulating material, and the like), the reverse engineer can discover the presence and the structure of metallic conductors used to interconnect the active devices in an integrated circuit by putting the needed time and energy into the reverse engineering task. However, since this time and energy is less than that required to design a new IC, reverse engineering has its followers. Indeed, the reverse engineer's object is to make a working, slavish copy of the original IC and the reverse engineer cares little about how the original IC was designed. The reverse engineer does not seem to be deterred by the fact that in many countries existing ICs are legally protected against copying by some form of mask works protection. As such, in order to protect the considerable investment made in new IC designs, other or additional steps are needed to deter such slavish copying.

SUMMARY OF THE INVENTION

The present invention provides a method and apparatus for preventing reverse engineering of integrated circuits by hiding interconnects between various devices and structures (for example, diodes, transistors, input/output connections, power supply connections and the like) so as to make it much more difficult for the reverse engineer to determine how the devices and structures, which can be seen on an integrated circuit, are interconnected.

In one aspect, the present invention provides an interconnect for interconnecting two spaced-apart implanted regions of a common conductivity type in an integrated circuit or device. The interconnect comprises a first implanted region forming a conducting channel between the two spaced-apart implanted regions, the conducting channel being of the same common conductivity type and bridging a region between the two spaced-apart regions, and a second implanted region of opposite conductivity type, the second implanted region being disposed between the two spaced-apart implanted regions of common conductivity type and being disposed over the conducting channel.

In another aspect the present invention provides a method of providing and camouflaging an interconnect between two adjacent implanted regions in an integrated circuit or device, the two adjacent implanted regions being of a common conductivity type. The method includes implanting a first region of the same common conductivity type, the first region being disposed between locations where said two adjacent implanted regions either have been or will be formed; and implanting a second region of opposite conductivity type to the common conductivity type, the second region over-lying the first region and having a concentration profile normal to a major surface of the integrated circuit or device with a concentration peak closer to the major surface of the semiconductor device than a concentration peak for the first implanted region.

BRIEF DESCRIPTION OF THE DRAWINGS

FIG. 1 shows a side sectional view through a semiconductor device or IC showing a portion of two active devices with a hidden implant providing an interconnect there between;

DETAILED DESCRIPTION

Figure 1:
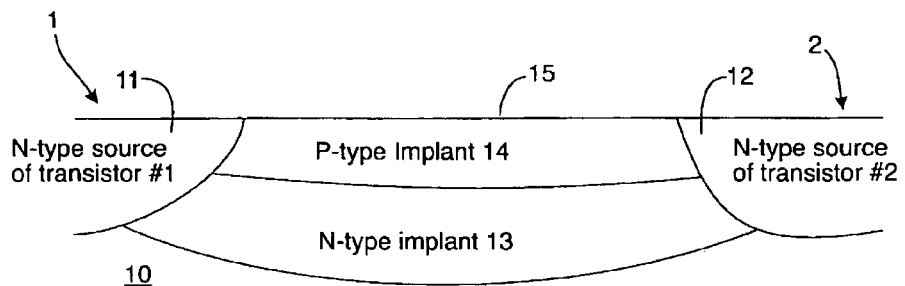

FIG. 1 is a cross sectional view through a portion of a two interconnected active devices 1, 2 in an integrated circuit.

Only a portion of two active devices are shown in FIG. 1 since this invention is concerned with techniques for camouflaging the interconnections rather than with the structure of the devices per se. The depicted portion of active device 1 is a N-type region 11 that could provide the drain, for example, of a first FET transistor 1 and could be formed as an implanted region with a N-type dopant by techniques very well known in the art. Those skilled in the art will recognize, of course, that the N-type region 11 could alternatively form a portion of a diode, a portion of a bipolar transistor or a portion of some other semiconductor structure. The depicted portion of active device 2 is a N-type region 12 that could form the source, for example, of a second FET transistor 2. The function or functions attributed to regions 11 and 12 are not particularly important to the present invention and they could represent any implanted semiconductor structure as a matter of design choice.

A complicated integrated circuit can literally comprise millions of active regions. Of course, not all active regions or devices are connected to an immediately adjacent active region or device although that is not infrequently the case. With respect to FIG. 1, it is assumed that active region 11 and active region 12 require, due to the design of the integrated circuit device in which they are used, interconnection. In the prior art, they might well have been interconnected by providing a thin layer of gold, aluminum or other metallic conductor on the presently exposed surface 15 between implanted regions 11 and 12. However, according to the present invention, regions 11 and 12 are interconnected by a N-type implanted region 13 which provides a conduction channel that interconnects the two active regions 11, 12. In order to camouflage the N-type implant 13, an implant of opposite conductivity type, for example, an implant of P-type conductivity is implanted in a shallower region 14 immediately above the conductive channel formed by region 13.

Those skilled in the art will realize that, if the P-type implant 14 were not employed, the N-type implant 13, which has a tendency to extend towards the surface 15 of the semiconductor device shown in FIG. 1, might be discoverable by stain and etch techniques. Depending on the type of implantation used, the concentration of the N-type dopant could be higher in regions below surface 15 compared to regions immediately adjacent surface 15. The relatively deeper N-type implant 13 provides a conduction path and will most likely have a relatively high dose of dopant to form the implant (for example, the amount of dosage of the dopant in the conduction path implant 13 could be the same as the dosage used to implant the active regions 11 and 12). The camouflaging implant, namely implant 14, is also a relatively heavy implant, in order to camouflage the opposite conductivity type material in region 13 forming the conducting channel. However, the camouflaging implant 14 is relatively shallow compared to the depth of the conducting implant 13.

Preferably the depth of the camouflaging implant 14 will be on the order of 0.1 $\mu$m while the depth of the conducting channel implant 13 will be on the order of 0.2 $\mu$m for FET transistor structures of the type partially depicted in FIG. 1. In the case of FET transistor structures, those skilled in the art will appreciate that active regions 11, 12 depicted in FIG. 1 would often form source and drain contacts of such FET transistor structures.

Those skilled in the art will appreciate that the camouflaging implant 14 being a P-type implant between N-type region 11 and N-type region 12 will not provide a conducting path. The depth of the implants are controlled, as is well known in the art, by the energy used in the implanting process. Preferably, the camouflaging implant 14 is formed first and by a relatively lower energy level compared to the implant which will form the conducting channel implant 13. Implanted region 14 should have the peak of its distribution range lying close to the surface. Thereafter, a relatively higher energy implant is performed to form region 13. The second implant, having a higher energy, should have the peak of its distribution range lying at least 2$\sigma$ distances away from the peak of the range distribution peak for implanted region 14. The value a corresponds to the range profile distribution width for implant 14.

Figure 3:
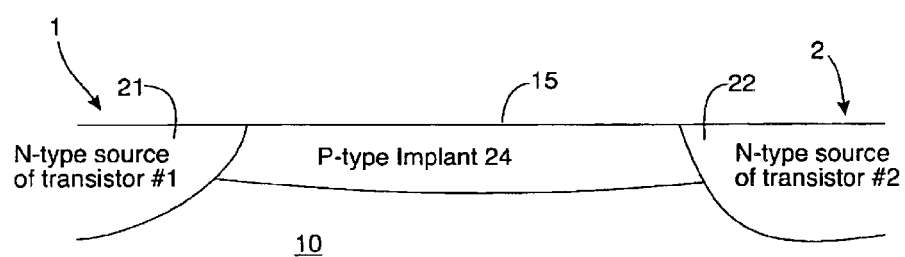
FIG. 3 is similar to FIG. 1, but no interconnect is provided between the active areas of the two transistors.

Due to the fact that some reverse engineers have etch and/or stain processes that can differentiate between N-type and P-type implants, the reverse engineer with such capabilities might infer the presence of the hidden conducting channel 13 by noting the presence of camouflaging region 14 if the camouflaging region 14 only occurred when it was used to hide conducting channel 13. The reverse engineer might observe region 14 (assuming the reverse engineer is able to differentiate it from regions 11 and 12 due to its different conductivity type) and, noting that it does not provide a conduction path itself, therefore conclude that region 14 has no purpose other than to hide an underlying implanted region 13. Thus, the reverse engineer might infer the presence of a conducting channel between regions 11 and 12 by the presence of the camouflaging implant 14. Thus, in order to thwart the reverse engineer with such capabilities, the relatively shallow implant 14 should be used in other places where no interconnect is desired to be formed between two adjacent active regions. See, for example, FIG. 3 where there are active regions 21 and 22 associated with two different active devices. Those skilled in the art realize, of course, that when you have two adjacent active regions they may or may not be interconnected due to the particular design requirements of the circuit. In FIG. 3 it is assumed that the two regions 21, 22 are not interconnected, but nevertheless a camouflaging P-type implant region 24 is formed between them. By using the structure shown in FIG. 1 in some areas (where interconnects are needed) and the structure shown in FIG. 3 in other areas (where interconnects are not desired), the reverse engineer will not be able to infer the presence of an interconnect by the presence of the camouflaging implant 14, 24. Of course, camouflaging implants 14 and 24 can be formed at the same time, if desired. They are given different reference numerals simply for the ease of discussion and depiction.

The configurations shown in FIGS. 1 and 3 will be repeated over and over again on a semiconductor chip, possibly more than a million times depending upon the complexity of the chip. Indeed, the camouflaging implant 14, 24 may be used over essentially 100% of the area of the chip dedicated for use as interconnections and where interconnections between active regions could plausibly occur, but do not occur. As such, said camouflaging implant 14, 24 preferably has a larger area, when viewed in a direction normal to a major surface of the integrated circuit or device, than the area of the conductive channels camouflaged thereby. If the reverse engineer can not infer the presence of a conductive channel merely by the presence of the camouflaging implant 14, 24, it makes the reverse engineer have to work all that much harder to try to determine just how the active regions in an integrated circuit are interconnected. Given the fact that there can be millions of interconnections and even more places where an interconnection could exist (but does not due to the particular requirements of the circuitry on the integrated circuit chip), this invention makes it impracticable for the reverse engineer to try to work out just where the interconnections do exist.

Figure 4:
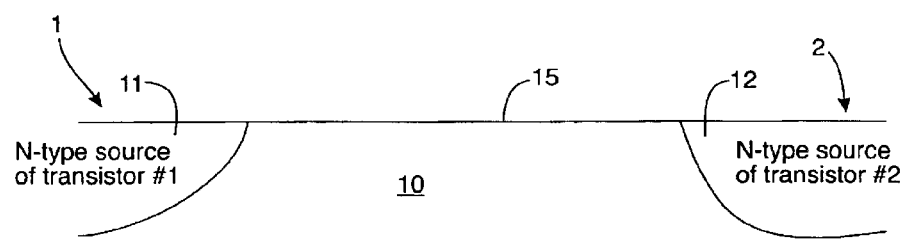
FIG. 4 is similar to FIG. 3, but the camouflaging implant shown in FIG. 3 has been omitted.

Of course, some practicing the present invention may elect not to use a camouflaging implant 14, 24 in certain regions between two active devices, as is shown in FIG. 4, to confuse matters still further for the reverse engineer. Thus, in some places, the implanted channel 13 of FIGS. 1 and 2 might be used without a camouflaging implant 14.

The more you confuse a reverse engineer, the more apt you are to thwart him at reverse engineering any particular integrated circuit. Therefore, other interconnection schemes can also be used in a particular IC design to camouflage further how the active regions are interconnected. Since there are millions of active regions in a large modern IC, different methods of interconnection can be combined for use together on a single IC. For example, in U.S. Pat. No. 5,866,933 a shallow implant is used to provide an interconnection between two active regions. Thus, some practicing the present invention for some interconnects on a chip may decide to use other inventions, including the invention of our prior U.S. Pat. No. 5,866,933 in order to provide other interconnections. The more you confuse the reverse engineer, the better chance you have of thwarting his efforts.

Those skilled in the art will realize that when the present invention is used in connection with the manufacture of semiconductor devices and ICs, the processes used to fabricate such ICs and devices may require additional processing steps to use the present invention or it may be possible to utilize the present invention, by modifying the masks for making a integrated circuit, without adding additional processing steps. It basically depends upon the fabrication processes used by a manufacturer of integrated circuits. Thus, for some manufacturers, they should be able to implement the present invention without adding to the cost of manufacturing semiconductor devices and integrated circuits. For others, additional processing steps will be involved, which will add to the cost of making a semiconductor device or IC. However, the additional cost of making the device or IC may well be justified in view of the fact that the resulting device will be more robust against reverse engineering.

Figure 2:
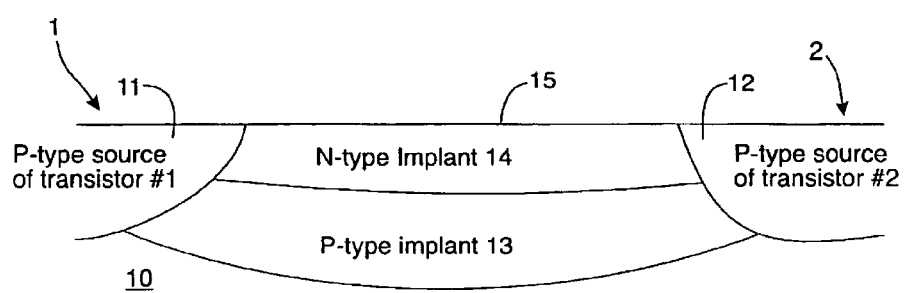
FIG. 2 is similar to FIG. 1, but the priority types of the devices and the interconnect have been reversed, compared to FIG. 1.

FIG. 2 is similar to FIG. 1, but the conductivity types of the various regions have been reversed. While those skilled in the art will realize, of course, that the N-type regions 11 and 12 forming the drain of a first transistor 1 and the source of a second transistor 2 is a situation which will frequently arise in an integrated circuit, the configuration of FIG. 2 can occur and therefore is depicted for the sake of completeness. P-type versions of the structures shown in FIGS. 3 and 4 are not included herein for the sake of brevity as those P-type structures are readily apparent to those skilled in the art.

Figure 5:
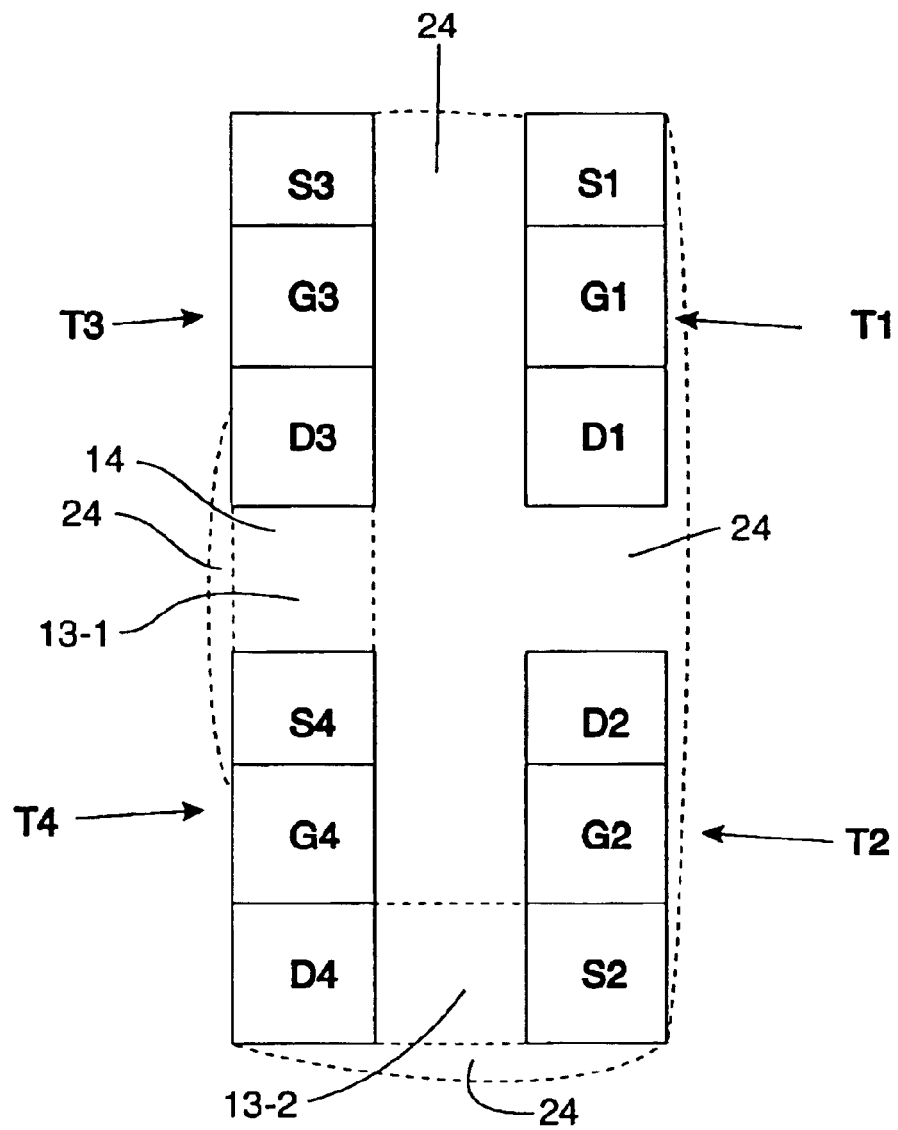
FIG. 5 is a plan view of a semiconductor device or IC having a number of implanted regions forming active regions of active devices therein, some of which are interconnected in accordance with the present invention.

FIG. 5 is a plan view of a small portion of an IC. Four FET transistors T1–T4 are depicted together with the drains D1–D4, sources S1–S4 and gates G1–G4. Drain D3 and source S4 are depicted as being interconnected by a buried implant 13-1. Drain D4 and source S2 are depicted as being interconnected by a buried implant 13-2. The regions in which interconnections could plausibly occur, but do not occur, and the regions overlying buried interconnects 13-1 and 13-2 are all covered with a camouflaging implant 14, 24. As previously indicated, camouflaging implant 14, 24 is preferably implanted during a single implant process and is only given different numerals herein to differentiate when it overlies an interconnect ( labeled numeral 14) and when it overlies regions where interconnections could plausibly occur, but do not occur (labeled numeral 24). The regions where buried interconnection 13 do or do not occur are governed by the particular function or functions to be performed by the IC in question. In the embodiment of FIG. 5 it is clear that the camouflaging implant 14, 24 has a significantly larger area, when viewed in a direction normal to a major surface 15 (See FIGS. 1 & 3) of the IC, than the area of the conductive channels 13-1 and 13-2 camouflaged thereby.

Those skilled in the art will appreciate that the devices T1–T4, while they are identified here as FETs in this embodiment, can represent other types of semiconductor devices with active regions some of which are interconnected by a conducting channel such as the channel 13-2 between S2 and D4 or the conducting channel 13-1 between S4 and D3. Of course, other or different interconnection patterns might well be used in practice. In any case, the conductivity type of regions 13-1, 13-2, D1, S2 and S4 (as well as the other active regions) would preferably be of a common conductivity type in this example and, for many integrated circuits, of N-type conductivity.

Having described the invention with respect to a preferred embodiment thereof, modification will now no doubt suggest itself to those skilled in the art. As such, the invention is not to be limited to the disclosed embodiments except as required by the appended claims.

What is claimed is:

1. A camouflaged interconnection scheme for interconnecting two spaced-apart implanted regions of a common conductivity type in an integrated circuit or device in a manner which inhibits reverse engineering thereof, the interconnection scheme comprising:

a first implanted region in the integrated circuit or device forming a conducting channel between two spaced-apart implanted regions, the conducting channel being of said common conductivity type and bridging a region between said two spaced-apart regions; and a second implanted region of opposite conductivity type in the integrated circuit or device, said second implanted region being disposed between said two spaced-apart implanted regions of common conductivity type and overlying said conducting channel.

2. The invention of claim 1 wherein said second implanted region overlying said conducting channel has a larger area, when viewed in a direction normal to a major surface of the integrated circuit or device, than has said conducting channel.

3. The invention of claim 1 wherein said two spaced-apart implanted regions form source and/or drain contacts, respectively, of two separate field effect transistors (FETs).

4. The invention of claim 1 wherein the second implanted region is provided in said integrated circuit or device over regions having no conducting channels formed therein.

5. The invention of claim 1 wherein the second implanted region has a depth less than a depth of the first implanted region.

6. A camouflaged interconnection scheme for interconnecting a plurality of spaced-apart implanted regions of a common conductivity type in an integrated circuit or device, the interconnection scheme comprising:

a plurality of interconnects each interconnecting selected implant regions of said plurality of spaced-apart implanted regions, each interconnect comprising a buried conducting channel bridging a region between the selected implant regions; and at least one implanted region of opposite conductivity type in the integrated circuit or device, the at least one implanted region of opposite conductivity type being disposed over at least a majority of said plurality of interconnects to camouflage said at least a majority of said plurality of interconnects.

7. The invention of claim 6 wherein said at least one implanted region of opposite conductivity type has a larger area than a total area of a related at least one of said conducting channels, when viewed in a direction normal to a major surface of the integrated circuit or device.

8. The invention of claim 6 wherein at least selected one of said spaced-apart implanted regions form source and/or drain contacts, respectively, of adjacent field effect transistors (FETs).

9. The invention of claim 6 wherein the at least one implanted region of opposite conductivity type is provided in said integrated circuit or device over regions having no conducting channels formed therein.

10. The invention of claim 6 wherein the at least one implanted region of opposite conductivity type has a depth less than a depth of each of said plurality of interconnects.

11. A buried interconnection scheme for interconnecting two spaced-apart doped regions of a common conductivity type in an integrated circuit or device in a manner which inhibits reverse engineering thereof, the integrated circuit or device having a plurality of spaced-apart regions arranged as transistors, said two spaced-apart doped regions each forming an active region in different ones of said transistors and each providing a different transistor function with respect to the transistor in which it forms an active region, the interconnection scheme comprising:

a first region in the integrated circuit or device disposed laterally of and in direct contact with the two spaced-apart regions, the first region being of said common conductivity type, the first region providing a buried conducting channel for the two spaced-apart regions; and a second region of opposite conductivity type in the integrated circuit or device, said second region overlaying said first region to conceal the conducting channel.

12. The interconnection scheme of claim 11 wherein said second region overlying said first region has a larger area, when viewed in a direction normal to a major surface of the integrated circuit or device, than has said first region.

13. The interconnection scheme of claim 11 wherein said two spaced-apart regions form source and drain contacts, respectively, of two separate field effect transistors (FETs).

14. The invention of claim 11 wherein the second region of opposite conductivity type has a depth less than a depth of said first region.

15. The interconnection scheme of claim 11 wherein the transistor function of a first one of said two spaced-apart doped regions is a drain function and the transistor function of a second one of said two spaced-apart doped regions is a source function.

16. A buried interconnection scheme for interconnecting two spaced-apart doped regions of a common conductivity type in an integrated circuit or device in a manner which inhibits reverse engineering thereof, the integrated circuit or device having a plurality of spaced-apart regions arranged as transistors, said two spaced-apart done regions each forming an active region in different ones of said transistors, the interconnection scheme comprising:

a first region in the integrated circuit or device disposed laterally of and in direct contact with the two spaced-apart regions, the first region being of said common conductivity type, the first region providing a buried conducting channel for the two spaced-apart regions;

a second region of opposite conductivity type in the integrated circuit or device, said second region overlaying said first region to conceal the conducting channel;

at least one additional spaced-apart region of the common conductivity type, said at least one additional spaced-apart region being spaced-apart from the two spaced-apart regions and forming an active region in yet another different one of said transistors; and at least one additional region of the opposite conductivity type is provided in said integrated circuit or device, said at least one additional region being disposed laterally of and in direct contact with one of the two spaced-apart regions and the at least one additional spaced-apart region of the common conductivity type, wherein the one of the two spaced-apart regions and the at least one additional spaced-apart region do not have the buried conducting channel formed therebetween.

17. An interconnection scheme for interconnecting a plurality of spaced-apart regions of a common conductivity type in an integrated circuit or device, the interconnection scheme comprising:

a plurality of buried elongate conducting channels, each buried elongate conducting channel being of the common conductivity type, each buried elongate conducting channel being laterally disposed of and in direct contact with selected ones of the plurality of spaced-apart regions, each buried elongate conducting channel providing an electrical connection between said selected ones of the plurality of spaced-apart regions, each buried elongate conducting channel having a major axis which is arranged in a non-parallel relationship to each other elongate conducting channel of said plurality of buried elongate conducting channels; and at least one region of an opposite conductivity type in the integrated circuit or device, the at least one region of opposite conductivity type being disposed over at least a majority of said plurality of buried conducting channels to camouflage said at least a majority of said plurality of buried conducting channels.

18. The interconnection scheme of claim 17 wherein said at least one region of opposite conductivity type has a larger area than a total area related to at least one of said buried conducting channels, when viewed in a direction normal to a major surface of the integrated circuit or device.

19. The interconnection scheme of claim 17 wherein at least selected ones of said spaced-apart regions form source and/or drain contacts, respectively, of adjacent field effect transistors (FETs).

20. The interconnection scheme of claim 17 further comprising at least one other region of the opposite conductivity type, the at least one other region of the opposite conductivity type being laterally disposed of and in direct contact with additional selected ones of the plurality of spaced-apart regions, wherein said additional selected ones of the plurality of spaced-apart regions are not electrically connected by one of said plurality of buried conducting channels.

21. The invention of claim 17 wherein the at least one region of opposite conductivity type has a depth less than a depth of each of said plurality of buried conducting channels.

22. A camouflaged interconnection scheme for interconnecting two spaced-apart implanted regions of a common conductivity type in an integrated circuit or device in a manner which inhibits reverse engineering thereof, the interconnection scheme comprising:
- a first implanted region in the integrated circuit or device forming a conducting channel between two spaced-apart implanted regions, the conducting channel being of said common conductivity type and bridging a region between said two spaced-apart regions; and
- a second implanted region of opposite conductivity type in the integrated circuit or device, said second implanted region being implanted into a portion of the first implanted region so that the second implanted region includes dopants corresponding to both the common and other opposition conductivity types, said second implanted region being disposed between said two spaced-apart implanted regions of common conductivity type and overlying said conducting channel.

* * * * *